(12) United States Patent
Voldman (10) Patent No.: US 7,089,520 B2
(45) Date of Patent: Aug. 8, 2006

(54) METHODOLOGY FOR PLACEMENT BASED ON CIRCUIT FUNCTION AND LATCHUP SENSITIVITY

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 10/707,069

(22) Filed: Nov. 19, 2003

(65) Prior Publication Data

US 2005/0108670 A1 May 19, 2005

(51) Int. Cl.
G06F 17/50 (2006.01)
G06F 9/45 (2006.01)

(52) U.S. Cl. .................... 716/9; 716/4; 716/10; 716/11

(58) Field of Classification Search ........ 732/298–299; 716/1–18

See application file for complete search history.

(56) References Cited

U.S. PATENT DOCUMENTS

| | | | |
|---|---|---|---|
| 5,796,638 A | 8/1998 | Kang et al. | |
| 5,901,065 A * | 5/1999 | Guruswamy et al. | 716/8 |
| 6,086,627 A | 7/2000 | Bass, Jr. et al. | |
| 6,878,595 B1 * | 4/2005 | Spratt | 438/288 |
| 2002/0040985 A1 | 4/2002 | Aldrich | |
| 2002/0144213 A1 | 10/2002 | Ramaswamy et al. | |
| 2004/0147080 A1 * | 7/2004 | Spratt | 438/289 |
| 2004/0262643 A1 * | 12/2004 | Voldman | 257/207 |
| 2004/0268284 A1 * | 12/2004 | Perez et al. | 716/11 |
| 2005/0071789 A1 * | 3/2005 | Voldman | 716/4 |
| 2005/0085028 A1 * | 4/2005 | Chatty et al. | 438/200 |

OTHER PUBLICATIONS

Ming-Dou Ker and Jeng-Jie Peng, Layout Design and Verification for Cell Library to Improve ESD/ Latchup Reliability in Deep-Submicro CMOS Technology, IEEE, Custom Integrated Circuit Conference, p. 537-540, 1998.*

T. Aoki, "A Practical High-Latchup Immunity Design Methodology for Internal Circuits in the Standard Cell-Based CMOS/BiCMOS LSI's", IEEE Transactions on Electron Devices, vol. 40, No. 8, Aug. 1993.

(Continued)

Primary Examiner—Vuthe Siek
Assistant Examiner—Nghia M. Doan
(74) Attorney, Agent, or Firm—Richard M. Kotulak, Esq.; Greenblum & Bernstein, P.L.C.

(57) ABSTRACT

A structure, apparatus and method for circuits to minimize sensitivity to latch. The method includes, for example, identifying element density of at least one functional circuit block and element attributes of elements associated with the at least one functional circuit block. An element density function parameterized from the element attributes is formed. The placement of the at least one functional circuit block is modified relative to other functional circuit blocks based on the element density function to substantially eliminate latching effects in a circuit.

16 Claims, 9 Drawing Sheets

OTHER PUBLICATIONS

B. Basaran, et al., "Latchup-Aware Placement and Parasitic-Bounded Routing of Custom Analog Cells", IEEE, 1993.

H. de La Rochette, et al., "The Effect of Layout Modification on Latchup Triggering in CMOS by Experimental and Simulation Approaches", IEEE Transactions on Nuclear Science, vol. 41, No. 6, Dec. 1994.

S. Bhattacharya, et al., "Design Issues for Achieving Latchup-free, Deep Trench-Isolated, Bulk, Non-Epitaxial, Submicron CMOS", IEDM, 1990.

M. Ker, et al., "New Experimental Methodology to Extract Compact Layout Rules for Latchup Prevention in Bulk CMOS IC's", IEEE Custom Integrated Circuits Conference, 1999.

M. Ker, et al., "Layout Design and Verification for Cell Library to Improve ESD/Latchup Reliability in Deep-Submicron CMOS Technology", IEEE Custom Integrated Circuits Conference 1998.

* cited by examiner

METHODOLOGY FOR PLACEMENT BASED ON CIRCUIT FUNCTION AND LATCHUP SENSITIVITY

BACKGROUND OF INVENTION

1. Field of the Invention

The invention relates to integrated circuits, and more particularly to a method and structure for optimizing latchup robustness in integrated circuits.

2. Background Description

As electronic components are becoming smaller and smaller along with the internal structures in integrated circuits, it is becoming easier to either completely destroy or otherwise impair electronic components from latchup. Latchup is when a pnpn structure transitions from a low current/high-voltage state to a high current/low-voltage state through a negative resistance region (i.e., forming an S-Type I-V (current/voltage) characteristic).

Latchup is typically understood as occurring within a pnpn structure, or silicon controlled rectifier (SCR) structure. Interestingly enough, these pnpn structures can be intentionally designed, or even unintentionally formed between structures. Hence, latchup conditions can occur within peripheral circuits or internal circuits, within one circuit (intracircuit) or between multiple circuits (intercircuit).

Latchup is typically initiated by an equivalent circuit of a crosscoupled pnp and npn transistor. Parasitic npn and pnp transistors associated with an inverter, with a base and collector regions cross-coupled, current flows from one device leading to the initiation of the second ("regenerative feedback"). These pnp and npn elements can be any diffusions or implanted regions of other circuit elements (e.g., P-channel MOSFETs, N-Channel MOSFETs, resistors, etc.) or actual pnp and npn bipolar transistors. In CMOS, the pnpn structure can be formed with a p-diffusion in an n-well, and an n-diffusion in a p-substrate (parasitic pnpn). In this case, the well and substrate regions are inherently involved in the latchup current exchange between regions.

The condition for triggering a latchup is a function of the current gain of the pnp and npn transistors, and the resistance between the emitter and the base regions. This inherently involves the well and substrate regions. The likelihood or sensitivity of a particular pnpn structure to latchup is a function of spacings (e.g., base width of the npn and base width of the pnp), bipolar current gain of the transistors, substrate sheet resistance and spacings (substrate resistance), the well sheet resistance and spacings (well resistance), and isolation regions.

Latchup can be initiated from internal or external stimulus. For example, latchup is known to occur from single event upsets (SEU). Single event upsets can include terrestrial emissions from nuclear processes, and cosmic ray events, as well as events in space environments. Cosmic ray particles can include proton, and neutron, gamma events, as well as a number of particle types that enter the earth atmosphere. Terrestrial emissions from radioactive events, such as alpha particles, and other radioactive decay emissions can also lead to latchup in semiconductors. Also, latchup can occur from voltage or current pulses that occur on the power supply lines, such as $V_{DD}$ and $V_{SS}$. Transient pulses on power rails (e.g., substrate or wells) can trigger latchup processes, as well.

Latchup can be initiated by negative transient on the $V_{DD}$ which can lead to a forward biasing of all the n-diffusions and nwell structures and electron injection throughout the semiconductor chip substrate. This produces a "sea of electrons" injected in the chip substrate. Equivalently, a positive transient on the $V_{SS}$ can lead to hole injection, and forward biasing of the substrate-well junction providing a "sea of holes" event. Latchup can also occur from a stimulus to the well or substrate external to the region of the thyristor structure from minority carriers.

In internal circuits and peripheral circuitry, latchup are both a concern. Latchup can also occur as the result of interaction of the ESD (electro static discharge) device, the I/O off-chip driver and adjacent circuitry initiated in the substrate from overshoot and undershoot phenomenon. These can be generated by CMOS off-chip driver circuitry, receiver networks, and ESD devices.

In CMOS I/O circuitry, undershoot and overshoot can lead to injection in the substrate. Hence, both a p-channel MOSFET and n-channel MOSFET can lead to substrate injection. Simultaneous switching of circuitry where overshoot or undershoot injection occurs, leads to injection into the substrate which leads to both noise injection and latchup conditions. Supporting elements in these circuits, such as pass transistors, resistor elements, test functions, over voltage dielectric limiting circuitry, bleed resistors, keeper networks and other elements can be present leading to injection into the substrate. ESD elements connected to the input pad can also lead to latchup. ESD elements that can lead to noise injection, and latchup include MOSFETs, pnpn SCR ESD structures, p+/n-well diodes, nwell-to-substrate diodes, n+ diffusion diodes, and other ESD circuits. ESD circuits can also contribute to noise injection into the substrate and latchup.

In a semiconductor chip environment, there exists a plurality of different stimulus as well a plurality of circuit functions. Peripheral circuits comprise, for example, ESD networks, transmitter and receiver networks, system clocks, phase lock loops, capacitors, decoupling capacitors and fill shapes. Internal circuits can consist of DRAM memory, SRAM memory, gate arrays, and logic circuitry. In this complex environment, the latchup event can be an interaction of intercircuit interaction or intracircuit interactions.

Additionally, the interaction of the different circuits can lead to an initiation of a primary latchup event followed by a secondary latchup event. Since the circuits in a complex chip are coupled through the substrate, well, and power rails, circuit blocks and elements within a circuit block can be interactive.

Moreover, latchup vulnerability is a function of the macroscopic local temperature in a region where latchup occurs. Certain regions of a functional chip are hotter than others with a high local temperature. Regions of a chip where the chip is hotter are more likely to initiate latchup concerns. The reason this is true is that the parasitic bipolar gain increases with increased temperature. Additionally, the diffusion coefficient is a function of temperature leading to longer diffusion lengths in the region of higher temperatures in a semiconductor chip.

For external latchup issues, there is two concerns. First the intrinsic latchup parasitic structure is more sensitive to the increased temperature leading to a higher risk of latchup. Second, the diffusion of minority carriers to the triggerable network is easier as the temperature increases as a result of the higher diffusion process. Hence it would be an advantage to place these hotter circuits farther from regions of overshoot and undershoot injection.

Additionally, latchup is a higher risk in regions where the incoming voltage exceeds the native voltage. Regions of semiconductor chips that provide programmable NVRAM power pins which receive voltages that far exceed the native voltage are sources for latchup concern. Mixed voltage offchip driver circuits, mixed voltage ESD networks, mixed voltage receiver networks, mixed voltage ESD power clamps all have higher power supply voltages than the native power supply voltage of the chip. Placement of circuit blocks and circuit functions with a high density of pnpn devices, or weakly robust networks that are near the high voltage supply are more vulnerable to trigger latchup in a chip.

SUMMARY OF INVENTION

In a first aspect of the invention, a method comprises identifying element density of at least one functional circuit block and element attributes of elements associated with the at least one functional circuit block. An element density function parameterized from the element attributes is formed. The placement of the at least one functional circuit block is modified relative to other functional circuit blocks based on the element density function to substantially eliminate latching effects in a circuit.

In another aspect of the invention, a method includes identifying element attributes within a functional circuit block and forming an element density function parameterized from the element attributes. The functional circuit block is placed based on the element density function to substantially eliminate latching effects in a circuit.

In yet another aspect of the invention, a method comprises forming a layout representation in a function block and defining a mathematical graph representation of latchup parasitic in the function block. A latchup density function from the mathematical graph representation is provided. The function block in a semiconductor chip is then placed to minimize latchup based on the latchup density function.

In another aspect, the method includes identifying injection source and elements associated with the at least one functional circuit block, evaluating global latchup of injector to functional circuit block distance and functional circuit block latchup, evaluating form factors and placement of the functional circuit block and determining whether there is a sufficient cost factor savings based on the form factors and placement of the functional circuit blocks. If there is not sufficient cost savings, then the method further includes modifying placement of the functional circuit block relative to other functional circuit blocks based on an element density function.

In a further aspect of the invention, an apparatus is provided having a circuit schematic representation of a at least one type of transistor and at least one type of structure. A design system defines the circuit schematic representation of the at least one type of transistor and one type of structure and a design system evaluates a circuit density and attributes of the at least one type of transistor and one type of structure. A design system places functional blocks based on latchup density based on the evaluation of the circuit density and attributes.

A computer program product is also provided.

DETAILED DESCRIPTION

In chip design, latchup sensitivity involves the interaction between different circuit types and functional blocks. Thus, placement of certain functional blocks relative to others and a means of defining the placement provide an advantage in chip design. The invention relates to a method and structure for optimizing latchup robustness in integrated circuits by providing a design system and methodology that addresses the circuit type relative to another circuit type where latchup becomes a design placement criteria for not just local interaction but global interactions of one circuit block to another circuit block (as a result of the interactive nature of certain circuit function and sensitivity relative to another circuit function). By way of example, the invention provides a method, apparatus and structure that predicts and improves the latchup tolerance by addressing:

- global as well as local interactions;
- the placement of certain circuit types and functional blocks relative to other functional blocks;
- global and local temperature and the placement of circuit types based on the power profile, and temperature distribution in a semiconductor chip;
- placement of circuit types with voltages above the native voltage away from circuit function blocks with a high density and sensitivity of pnpn circuits;
- the form factor of a circuit block to minimize the propagation of latchup across functional blocks to improve the latchup propagation into sensitive functional blocks; and
- placement of circuit types with voltages above the native voltage, temperature distribution, circuit function block density and sensitivity of pnpn circuits, and co-optimize to improve the latchup in a semiconductor chip.

As such, the invention is capable of predicting latchup within a circuit function and between circuit functions in a complex semiconductor chip and thus improving performance by eliminating latchup conditions.

Figure 1:
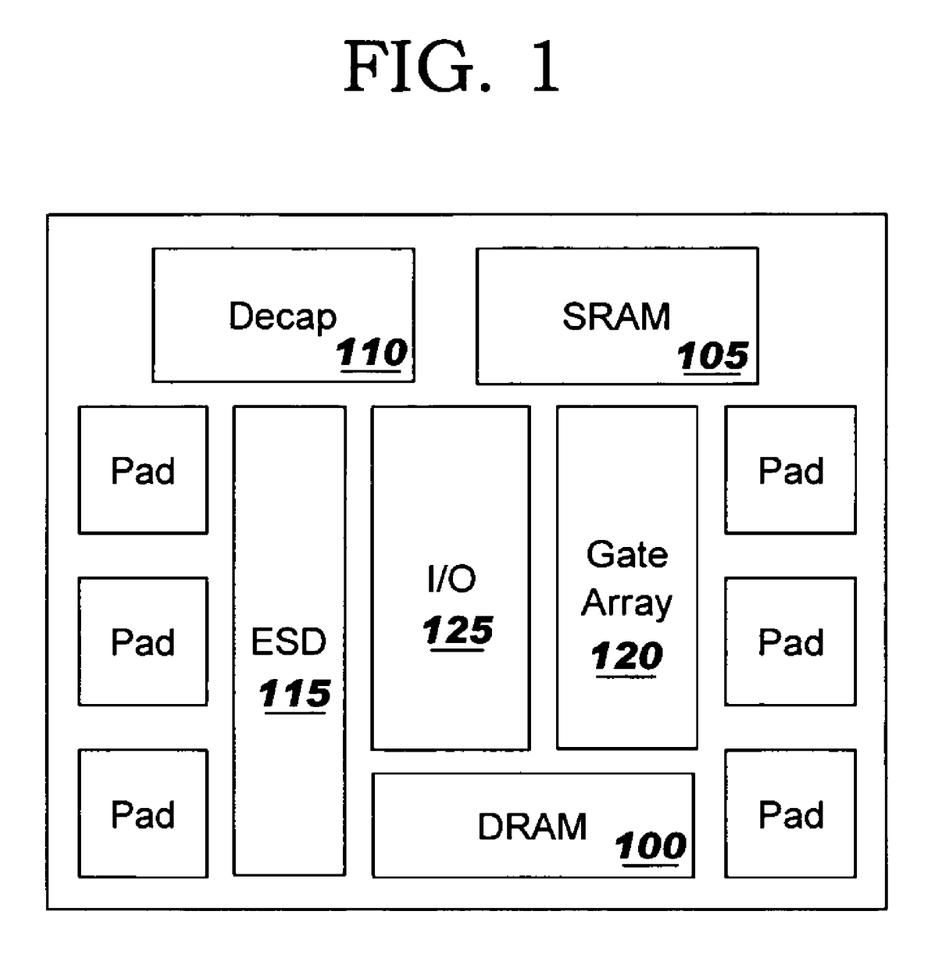
FIG. 1 is a map of chip function organization.

Referring now to the drawings, FIG. 1 is a map of chip function organization. Semiconductor chips consist of functional blocks of circuit types. In a chip design there are, for example, DRAM arrays 100, SRAM arrays 105, decoupling capacitors 110, ESD input networks 115, gate array logic regions 120, an I/O 125 and other circuit functions such as, for example, off-chip driver (OCD) banks, receiver banks, ESD power clamps, analog circuitry, custom logic, voltage islands, wiring bays, fill shapes and other circuit function. Organization of these functional blocks are decided by wirability and performance.

As should be well understood, each of these functional blocks have different voltage conditions, overshoot and undershoot characteristics, power profiles, and density of p-channel MOSFETs, and n-channel MOSFETs. For example, Table 1 provides a brief exemplary description of these conditions.

| Ckt | V | Over/Under | Power | T | PFET | NFET | PNP Density | NPN Density | PNPN Density |
|---|---|---|---|---|---|---|---|---|---|
| SRAM |  | Low | Low | Low | High | High | High | High | High |
| DRAM |  | Low | Low | Low | High | Low | High | Low | Low |
| OCD | Hi | High | High | Hot | Big | Big | Low | Low | Low |
| ESD | Hi | High | High | Hot | Low | Low | Low | Low | Low |
| ESD Power | Hi | High | High | Hot | Low | Big | Low | Low | Low |
| Decap | Hi | Low | Low | Low | Low | Low | Low | Low | Low |
| Gate Array | Lo | Low | High | Hot | High | High | High | High | High |
| Wiring | Hi | None | High | Low | None | None | None | None | None |

According to data, each type of functional block has a set of criteria that can be evaluated to determine the voltage, the power, the local temperature, the PFET density, the NFET density, the PNP parasitic density, the npn parasitic density, the pnpn parasitic density, and other parameters related to latchup optimization. In an actual chip design, these values can be obtained from a design system. For example, voltage value is important in that the circuit of interest in the functional block will be able to evaluate the voltage margin between the applied voltage and the parasitic circuit holding voltage within that functional block.

Temperature can be obtained from advanced tools that determine the power. For example, iEDISON, and other simulators can determine chip power and temperature and extract out a temperature field where the placement of the chip after an initial guess is defined. There are known tools that extract interconnect and substrate temperature profile in a full chip cross section.

In regions where the chip is hot, minority carriers will diffuse since $D = \mu k T/q$ and $L = (D\tau)^{1/2}$ D=–diffusion coefficient;
μ=mobility;
K=Boltzmann constant;
T=temperature;
Q=charge;
L=diffusion length; and
τ=recombination time.

The diffusion of minority carriers extends the risk of latchup across a functional block. The propagation of latchup across functional blocks are also important to prevent migration of latchup and soft error disturbs from latchup injection physics from one block to another. Hence the form factor and its relation of the adjacent functional blocks and form factor of any functional block can be optimized to minimize latchup.

Now, PFET density can be obtained in a functional block from an extractor in the number of PFET instances in a functional block of a chip. Likewise, NFET density of a functional block can also be evaluated. The density of the PFET and NFET are key to the potential latchup disturbances that can occur. PFET disturbs can influence the timing of some circuits from voltage overshoots. NFET disturbs occur from substrate undershoots. When the density of circuits that are PFETs are near a source of overshoot, circuit disturbs and forward bias pnp injection can occur. Hence, it is an advantage to have a design system where the PFET density of a given functional block is not near a source of overshoot.

Likewise, when the density of circuits that are NFETs are near a source of undershoot, circuit disturbs and forward bias npn injection can occur. Hence, it is an advantage to have a design system where the NFET density of a given functional block is not near a source of undershoot.

In some circuit types, the circuit may contain only PFETs and no NFETs, or vice versa. In that case, no latchup can occur since no parasitic pnpn structures are evident. As a result, circuit functional blocks that do not form p-n-p-n pairs are not sensitive to latchup. Hence if an optimization is chosen to minimize latchup, the information of the pnpn pairs that are present may be important to understanding whether the functional block is latchup sensitive.

In the case of a circuit group which has CMOS logic, PFET and NFET circuits are typically present to form CMOS inverters. In this case, the density of PFETs, and the density of NFETs are high. Hence, the identification of PFET-NFET pairing, and p-n-p and n-p-n coupling forming a pnp-n may be important. These pnpn circuits are then sensitive to temperature, power, overshoot, undershoot, external sources, and injection mechanism (e.g., single event upsets such as alpha particles, cosmic rays, muons, neutron, proton, and other events). Injection from adjacent circuit functions can trigger these structures. In this case the knowledge of the pnpn pair density, pnpn "strength" or latchup resiliency, the orientation and form factor in the functional block and spatial density may be of interest to determine the propagation of latchup within a functional block.

Modifying the placement of the functional block relative to other functional blocks and identification of the form factor, and spatial densification or layout optimization in the functional block can influence the propagation of latchup throughout the chip. In the process of bit disturbs or soft latchup events, and substrate current injection, it is an advantage to provide circuits types that collect the charge as well as not propagating the charge transport.

Decoupling capacitor elements are used as fill space or to simply add capacitance to the semiconductor chip. The decoupling capacitor circuit uses NFETs. These networks can bring higher than native voltage to the semiconductor chip dependent on which power supply they are being connected to in the circuit. Experimentally, it has been shown that decoupling capacitor banks or fill areas do not lead to the propagation of latchup in a semiconductor chip. Hence the placement of using a decoupling capacitor bank near an injecting source is good to avoid the propagation of latchup or soft latchup (disturbs). Decoupling capacitors will have a low density of npns, no pnp density, and hence no pnpn density. A design system and chip optimization CAD system, as disclosed herein, chooses to place these elements about a semiconductor chip near an injection source, which provides advantages known to one of skill in the art.

DRAM arrays utilizing a PFET pass transistor will have an n-well region holding the DRAM cells. The n-well will serve as a source to collect charge from an injection source. In this type of circuit, there is a high pnp density, no npn density value, and hence no pnpn structures. Hence, as a second example, the invention is capable of determining the placement of DRAM cells which are isolated from the substrate to avoid the propagation of latchup.

SRAM cells utilize both a PFET and an NFET in close proximity. Like Gate-array or CMOS logic, this has a high pnp density, npn density and a very high pnpn density. As a result, SRAM should be moved away from injection sources to avoid latchup propagation, bit disturbs and soft latchup events, as can be determined with the invention.

Figure 2:
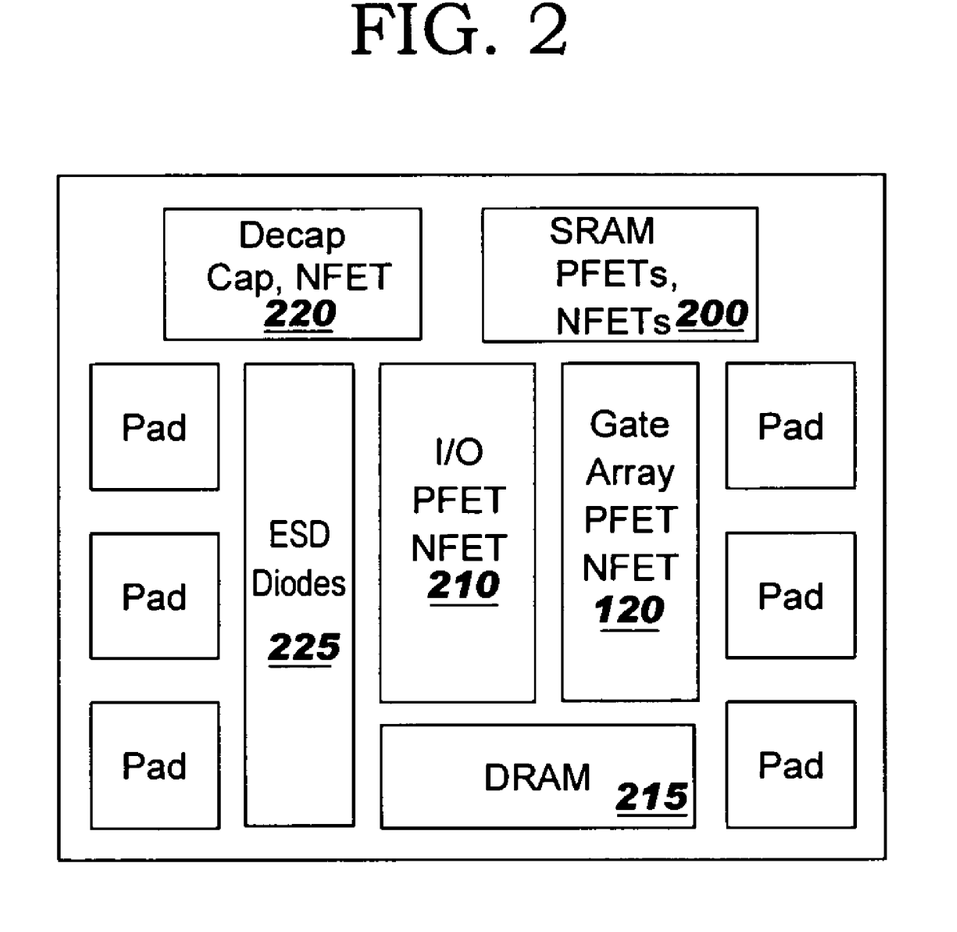
FIG. 2 is a map of chip function circuit type within each functional grouping.

FIG. 2 is a map of chip function circuit type within each functional grouping. A floor plan of a chip is shown with the areas labeled for the functional blocks. Semiconductor chips consist of peripheral circuits, CMOS logic, decoupling capacitor banks. The floor planning and adjacency of different functional blocks on a global level as well as a local level is key for external latchup events. The functional groupings represented in FIG. 2 include, for example, SRAM, PFETs and NFETs 200;
Gate array, NFET, PFET 205;
I/O PFET NFET 210;
DRAM 215;
Decap Cap, NFET 220; and
ESD diodes 225.

Figure 3:
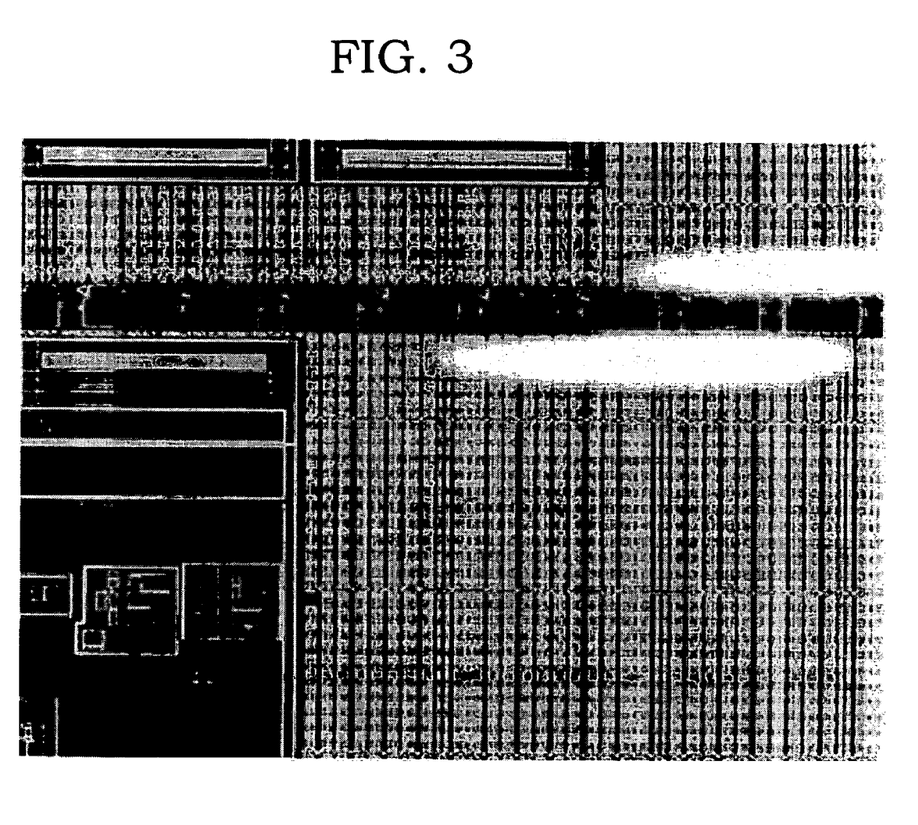
FIG. 3 is an example demonstrating the latchup between adjacent functional blocks.

FIG. 3 is an example demonstrating the latchup between adjacent functional blocks. It has been shown experimentally that the effect can propagate from an ESD diode in peripheral cell, serving as the injector source, to an I/O bank. Factors that influence the latchup include, for example, Orientation and placement of the injecting source;
Distance between the ESD element and adjacent region of high pnpn density;
Form factors of the functional blocks; and
Guard ring utilization between the functional blocks.

A method that addresses both global effects for latchup propagation as well as local effects of the latchup strength is important for evaluation of latchup effects, as is discussed throughout with relation to the invention.

Figure 4:
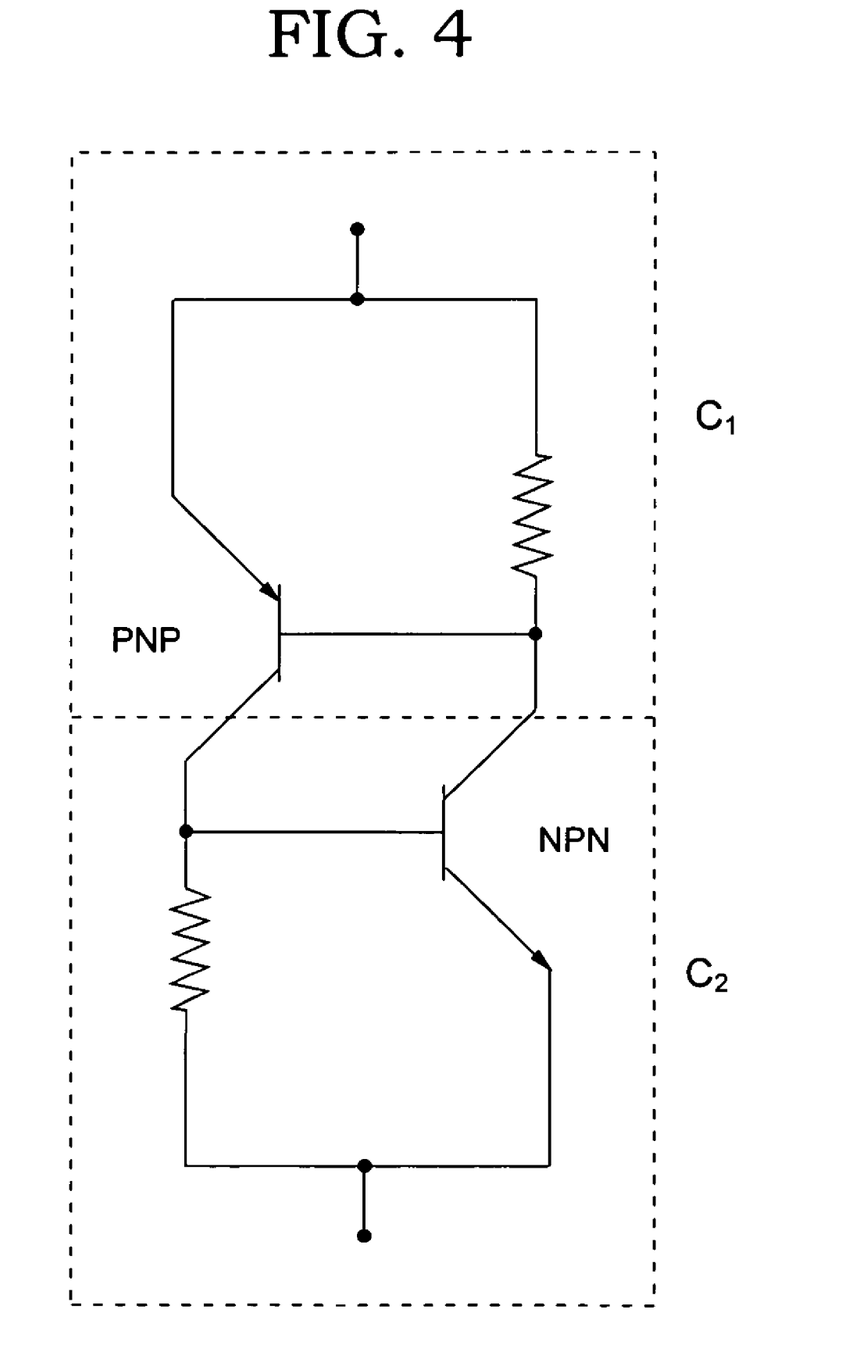
FIG. 4 illustrates the circuit schematic of a latchup structure.

FIG. 4 illustrates the circuit schematic of a latchup structure. Within $C_1$ is a pnp bipolar transistor and a resistor $R_1$. Within $C_2$ is a npn transistor and resistor $R_2$.

Latchup structures can be identified by diffusions that exist in the silicon substrate. For example, by using the invention, a graph model would address the following:

NPN density—Number of npn per unit area;
NPN parameter strength (current gain);
PNP density—Number of pnp per unit area;
PNP parameter strength (pnp current gain);
Parameterization of the NPN density as a function of the strength parameters statistics;
Parameterization of the PNP density as a function of the strength parameters statistics;
PNPN density; and
PNPN parameter strength (Beta product ($\beta_{pnp} \times \beta_{npn}$) relationship including substrate and well resistances). ($\beta_{pnp}$ is the bipolar current gain of the pnp transistor and $\beta_{npn}$ is the bipolar current gain of the npn transistor.)

Figure 5:
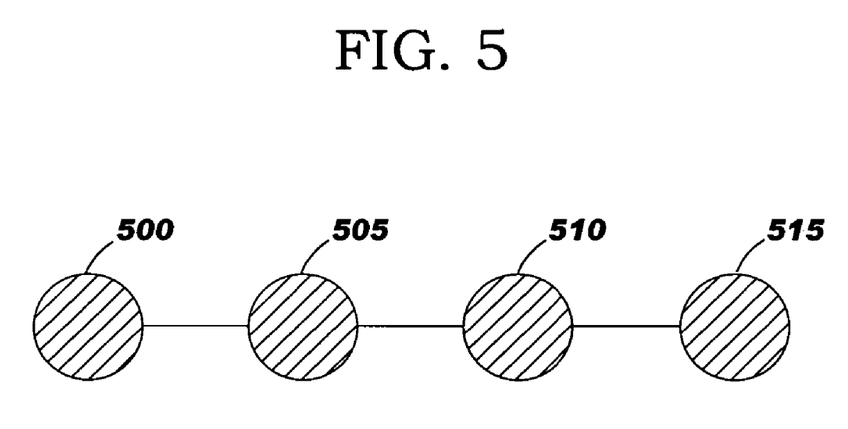
FIG. 5 illustrates an embodiment of a graph model representing a structure of the latchup circuit apparatus highlighting the pnpn structure.

FIG. 5 illustrates an embodiment of a graph model representing a structure of the latchup circuit apparatus highlighting the pnpn structure in accordance with the invention. A latchup structure includes a p+ diffusion inside a n-well structure (500), a n-well region (505), a p substrate (510) and a n+ diffusion in a substrate (515). A lateral pnp transistor of FIG. 4 within $C_1$ is formed between the p+ shape, n-well, and the p substrate, 500, 505 and 510. A lateral npn bipolar transistor of FIG. 4 within $C_2$ is formed between the n-well, the p− substrate and the n+ shape 505, 510 and 515. The base width of the pnp is the space between the p+/n-well junction, and the n-well/substrate junction. The npn base width is the space between the n-well/p− substrate edge and the n+/p− substrate junction edge. The well resistance is associated with the distance from the n-well contact to the p+ diffusion in the n-well. The substrate resistance is associated with the distance from the p− substrate contact and the n+ diffusion in the p− substrate. This may also extend, in embodiments, to diodes, MOSFET p-channel devices, and bipolar elements. It is understood also that the n-type region in the substrate can be a diode, a well, a MOSFET n-channel device and bipolar elements.

Figure 6:
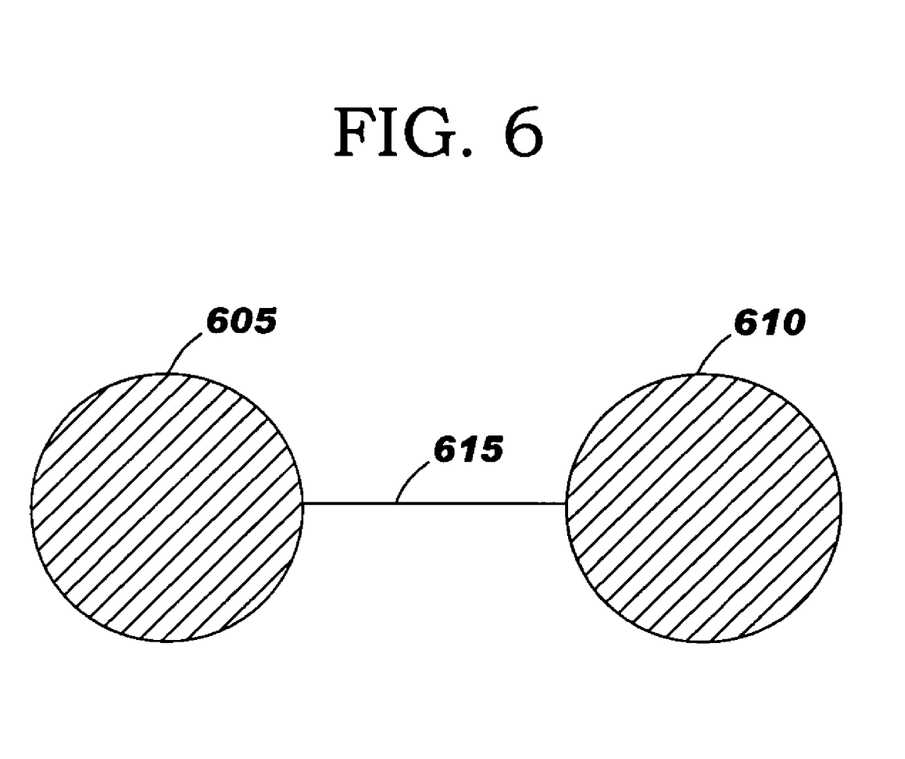
FIG. 6 illustrates an embodiment of a graph model representing a structure of the latchup circuit highlighting the coupling between a pnp structure and an npn structure.

FIG. 6 illustrates an embodiment of a graph model representing a structure of the latchup circuit apparatus highlighting the pnpn structure in accordance with the invention. A first representation of the circuit can be shown using a "circle" and "line" structure diagram representing a graph model of the pnpn structure. In this representation, four regions are created, where each region represents the information contained associated with the physical diffusions and corresponding shapes. Forming a p-n-p-n graph, it is possible to represent the schematic diagram of a pnpn structure. In the left hand side (LHS) 605, p shape represents the emitter of the pnp transistor diffusion. The LHS n shape represents the base of the pnp transistor. The right hand side (RHS) 605 p region represents the substrate. The RHS n region represents the n-diffusion. The line 610 connecting the circles represents the interaction between the two circles and contains the corresponding attributes.

First, in this graph, the line represents metallurgical junctions between the physical regions. Additionally parallel circuit elements exist as well in parallel with the physical junction. Hence in this graph representation, a well resistance exists between the LHS p-n region. Additionally, a substrate resistance exists between the RHS p-n region. Hence, in the LHS p-n region, the line attributes represents the metallurgical junction, as well as the well resistor element. On the RHS p-n region, the line attribute represents the metallurgical junction as well as the substrate resistor element.

In this graph theory representation, the circles also contain other attributes. The attributes can include, for example, power rail voltage and currents, d.c., voltage values, transient voltage or current excursions. The attributes in this representation may also contain dimensional area, resistances and other parasitic circuit information. The parameters are extracted from simulators and the information is stored and associated with the attributes of the physical region.

From this graphical model, voltage or current stimulus that influence the potentials or current injections contained within the p-n-p-n regions influence the potentials and can lead to latchup initiation. Any type of latchup event, whether SEU (single event upsets), external latchup processes, voltage or current transient phenomenon can influence the dynamic response of this graph. For example, substrate injection influences the current observed in the LHS n circle 605 and the RHS p circle 610. From this model, a pnp as well as a npn can be identified.

FIG. 6 may also illustrate an embodiment of a graph model representing a structure of the latchup circuit highlighting the coupling between a pnp structure and a npn structure. As a representation, the graph model can be regarded as a first circle, pnp 605 and a second circle npn 610 connected by a line 615. In this representation, the line 615 connecting the pnp and the npn circle regions 605 and 610, respectively, represents the crosscoupling and regenerative feedback between the pnp and the npn. In this graph representation, the dimensional information, physics and process information are contained within the individual circle (605 or 610). Additionally, a physical circuit device model of the pnp transistor and the npn transistor may contain all the I-V information of the semiconductor device. In this graphical representation, the line or arc 615 represents the linkage between the two physical domain and coupling. This higher order representation contains all the device attributes and identifies the location of one device relative to another device.

As should be known, two important conditions exist for the latchup to occur. The pnp and the npn must be forward active. This means that the sum of the forward voltages must be greater than 1.2 volts, for example (although other voltages may apply). For this to occur, a voltage drop must occur across the well and substrate resistors of at least 0.6 V, for example. The second condition is that regenerative feedback must occur. This requirement can be evaluated as a simple algorithm that the product of the pnp and the npn current gain is greater than unity, as should be known to one of ordinary skill in the art. A second algorithm or equation addresses injected current and the well and substrate resistance value. Additionally, the emitter resistances can also be included in the regenerative feedback condition. These parameters or attributes will be used for the evaluation of the "strength" of the npn devices or pnp devices or pnpn devices.

Figure 7:
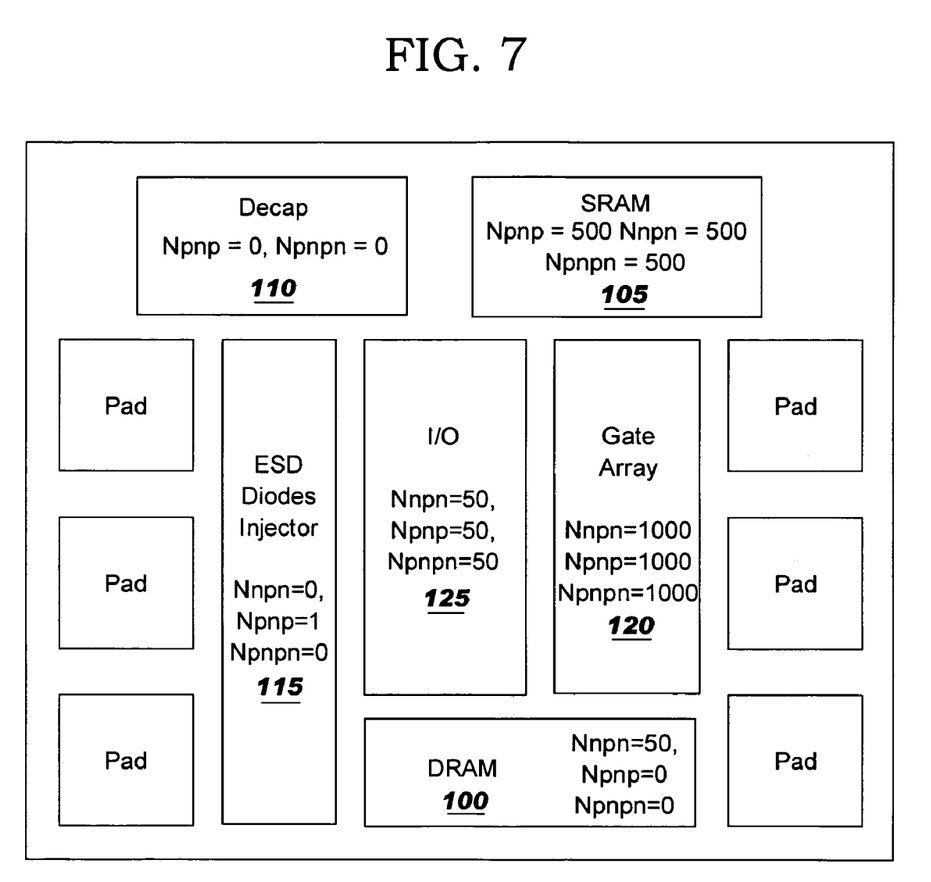
FIG. 7 is a mapping of pnp, npn and pnpn density in a functional block as a function of pnpn density (number) and strength.

FIG. 7 is a mapping of pnp, npn and pnpn density in a functional block as a function of pnpn density (number) and strength parameter:

$N_{npn}$ (S)
$N_{pnp}$ (S)
$N_{pnpn}$ (S)

In this fashion, it is now possible to define a latchup density functional, where the strength parameters will provide both a sensitivity parameter to latchup as well as the density in a global system. In this example, using the function blocks of FIG. 1, for example, the SRAM 105 includes:

$N_{npn}$ (500)
$N_{pnp}$ (500)
$N_{pnpn}$ (500)

Other examples are also shown in FIG. 7.

In view of the above discussion, in the methodology of the invention, there exists a density of pnps and npns within a given functional block of circuits, as well as pnpn. Visually, these can be defined as within the "area" of the functional block. There also exists the possibility that the pnp or the npn is formed on the perimeter between the functional blocks. Additionally, the pnp of one functional block device on the perimeter can be intercoupled with the npn of a second functional block. Hence, it is possible to define "area" or volumetric density functions for the interior of the functional blocks and a "surface" density function on the perimeter. It is also possible to define these as inter-versus intra-functional block parasitic elements. The methodology of the invention can re-optimize the circuit to minimize the surface density function of pnpns, npns, and pnps by moving functional blocks to other locations, or space the functional blocks apart to reduce the coupling strength between these elements. The methodology can form a means to space these apart to either eliminate the density of these elements, or the F strength factors of these elements.

In the invention, the "area" placement and area density function is addressed first in the optimization, followed by the surface density relative to adjacent blocks. The density of the perimeter of npn, pnp can be defined within the block, and the density and corresponding strength factors are to be addressed after the placement of the functional blocks and adjacency is established. Spacing between these blocks can then be re-optimized to weaken the F parameters, or choose a new location for that functional block.

Latchup Condition and Strength Functional

In the invention, Minimum Condition for Regenerative Feedback addresses the parasitic current gains and the well and substrate resistor elements in the latchup circuit. The parasitic current gains and resistors are extracted from known spacings, and physical parameters associated with the technology.

$$\beta_{npn}\beta_{pnp} > (I_{DD} + I_{RW}\beta_{npn})/(I_{DD} - I_{RW} - I_{RS}(\beta_{npn}+1)/(\beta_{npn}))$$

and $$(V_{BE})_{pnp} > 0.7$$

$$(V_{BE})_{npn} > 0.7$$

where $$I_{RS} = (V_{BE})_{pnp}/R_S$$

$$I_{RW} = (V_{BE})_{npn}/R_W$$

$R_S$ is the substrate resistor and $R_W$ is the well resistor on an n–1 substrate wafer and a p-type well. I is current and β represents $\beta_{pnp} \times \beta_{npn}$. The parameter $I_{DD}$ is the current that flows through the circuit in FIG. 4 from the cop node of $C_1$ to the bottom node of $C_2$. It should be understood that the equations sets provided herein are applicable for an n–1 wafer but can be easily modified by those of skill in the art for a p–1 substrate wafer and an n-type well type well.

Substrate resistance is typically provided as in units of Ohm-cm which is designated as ρ. Substrate resistance is designated as $R_s$ where the value is a function of the distance between the n+ substrate contact and p+ diffusion of the circuit, and divided by a cross sectional area.

$$R_s = \beta(L/A)$$

For the well resistor it is a function of the distance between the p+ well contact and the n+ diffusion of the circuit, divided by the width of the contact.

$$R_{w} = \rho_{sh\ (Well)}(L/W)$$

To evaluate the magnitude of the latchup sensitivity of the specific circuit, it is possible to define a metric where:

$$F = \beta_{npn}\beta_{pnp}/[(I_{DD}+I_{RW}\beta_{npn})/(I_{DD}-I_{RW}-I_{RS}(\beta_{npn}+1)/(\beta_{npn}))]$$

From this term, if F is less than 1, then latchup does not occur. If F is small (e.g., much less than 1) then it is a weak phenomenon. Using the magnitude of F, one can use this as a latchup margin metric. Again, one of skill in the art can modify these relations for the p− substrate case.

If F>1 then latchup will occur. If F>>1 then the latchup sensitivity of the specific circuit is very high. This can be used a strength variable for a given pnpn structure in a given circuit for a fixed p+ to well space, n+ to well space, and a given substrate contact and given well contact spacing.

Density Functional

A density functional can be created to evaluate the density of pnpn structures, pnp structures and npn structures. A function can be created that identifies the pnp, the npn and counts the number of these elements.

Counting pnp Elements

To count the number of the pnp elements, such can be determined by counting the number of design shapes that allows p+ dopant implants to enter the silicon inside the isolation openings for those contained inside the n well. For example, a block mask named BP over ROX (isolation opening) inside an n well shape (NW) will achieve a p+ diffusion. In this fashion, the number of pnp elements can be determined. The counting of independent BP shapes indicates the number of pnp elements. For each independent pnp, a pnp strength parameter can be evaluated similar to the above expression for the pnpn. This will be a function of the current gain of the pnp and the n-well contact.

In a CADENCE™ environment, the number of instances of a given p-cell can be counted. The pnp can be counted by evaluation of the type of p-cells and the number of those p-cells. For example, by evaluating the number of instances of the PFET device p-cell, it is possible to determine the number of PFETs. To evaluate the density of these elements, the total number can be divided by the total area of that functional block of circuits.

Counting npn Elements

To count the number of the npn elements, the number of (isolation openings outside n-well) or isolations which are not can determine the number of n diffusions in a functional block (excluding the number of substrate contacts). In this fashion, the number of npn elements can be determined. The counting of independent ROX shapes indicates the number of npn elements. For each independent npn, an npn strength parameter can be evaluated similar to the above expression for the pnp. This will be a function of the current gain of the npn and the substrate contact resistance.

In a CADENCE environment, the number of instances of a given p-cell can be counted. The npn can be counted by evaluation of the type of p-cells and the number of those p-cells. For example, it is possible to evaluate the number of instances of NFET transistors. That will be the number. To evaluate the density of these elements, the total number can be divided by the total area of that functional block of circuits.

Counting the pnpn Density

Knowing the number of pnp devices, it is possible to determine if there is a corresponding npn in the region of the pnp. Conversely, knowing the number of npn elements, it is possible to determine if there is a corresponding pnp in the region of the npn. In the first case, if an n diffusion ROX opening is adjacent to the pnp device, then a pnpn is formed. Conversely, if a ROX opening p in an NW with BP, a p-diffusion exists. Then a pnpn is formed and the number can be identified. In a CADENCE environment, p-cells with pnp elements which are adjacent to p-cells with NPN elements, then a pnpn can be identified.

It should be understood by one of ordinary skill in the art that, in all the above cases, a filter distance can be applied if the relative spacing between the pnp and a adjacent ROX or an npn and an adjacent p diffusion is significant, it can be eliminated (e.g., spatial filtering is possible to simplify calculations truncating very weak F factors). The F factor can be evaluated in a simplified case with an initial guess of the currents, or the elimination of the resistor values for a first cut, followed by a refined analysis.

Injection-to-Circuit Block Placement

From the above circuit blocks, the number of elements pnpn, and npnp can be evaluated. Additionally, these densities can be a distribution where there is a distribution of different elements of strength F from the above expression (e.g., $N_{npn}(F)$, $N_{pnp}(F)$, $N_{pnpn}(F)$).

Now, assuming an injector at a vector position R, and a collecting structure at vector position $r_i$, the relative distance between the location of the injecting source and the collecting circuit (i) is designated as a vector $R-r_i$. The relative distance between the location of the injecting source and the collecting circuit j is designated as a vector $R-r_j$. The relative distance between the location of a first circuit at (i) and the second circuit (j) is designated as a vector $r_i-r_j$. A spatial function can be established which is the relative strength of injection source at R at the position (i). Calculation of the functional which is the density of pnpn elements as a function of the strength factor of each pnpn elements can be evaluated, and a "chip sector" can be evaluated, as discussed.

A Cost Function is then created where:
if the $N_{pnpn}(F>1)$ of a first chip region is greater than the $N_{pnpn}(F>1)$ of a second chip region then the first chip region is moved farther away from the injection region of a chip.
if the $N_{pnpn}(F<1)$ of a first chip region is greater than the $N_{pnpn}(F<1)$ of a second chip region then the first chip region is moved closer to the injection region of a chip.
if the $N_{pnpn}(F)=0$ for a first chip region, then move closest to the injection region of a chip.

Refined Analysis

In the case the evaluation requires better definition, the injection source magnitude can be added to the functional based on the initial position. The injection current can be assumed to be of strength $$I_{injection}=[I_{inj}(R))/|R-r_j|^2]\exp-\{|R-r_j|/(D\tau)^{1/2}\}$$

Letting the value of $I_{injection}=I_{RW}$, the functional F can be calculated for each pnpn in a given chip region. In this case, after the $N_{pnpn}$ are identified, the current term can be placed into the analysis to evaluate $N_{pnpn}(F)$. In this fashion, the initial guess can be modified with the current term, assuming it is injection into the well resistor element. In this fashion, the cost function block can be re-evaluated taking into the relative account of the circuit (i) to the injection source.

Local Re-Optimization of the Local Circuit When F>1.

In the case that the functional block contains elements whose initial state is F>1 after placement of the functional block, it is possible to perform a second re-optimization of the local elements by changing the spacing of well contact and substrate contacts. In this case, the circuit is now fixed and the $N_{pnpn}(F>1)$ elements in the block are then re-optimized such that N pnpn (F>1)→N pnpn (F<1). This is achievable by moving the substrate and well contacts for these specific elements to reduce the F factor. In this case, the number of potential latchup sensitive circuits can be reduced, or eliminated.

Secondary Source Evaluation

In the case that there is a high density of pnpns where (F>1), the interaction between these can lead to a secondary effect. In this fashion, a secondary source term can be created where the summation of elements (j) can influence the element (i) where the current $I_{Secondary\ (i)} = \text{Sum(for all } j \text{ where} F>1)[I_{inj}(j)$ $(R))/|r_j-r_i|^2]\exp-\{|r_j-r_i|/(D\tau)^{1/2})\}$ In this fashion, the secondary elements can contribute to the IRW and the evaluation of F can be re-evaluated to include local secondary sources. As a result, these terms can be also re-optimized based on the secondary factors as well.

Optimization Based On Chip Temperature

The placement of the chip segments with $N_{pnpn}(F)$ are placed based on a functional solely based on latchup sensitivity and relative location to a region of concern.

It should be understood that this method can be applied to a region of a chip whose temperature is high. If the metric of interest includes temperature, the chip temperature influences the bipolar current gain of the parasitic elements. In this fashion, the geometric placement may be chosen based on peak temperature at location R.

According to the methodology of the invention, the F function is calculated based on the temperature field at the different spatial location. In this fashion, chip book placement could be optimized based on relative location to peak temperature and the functional $N_{pnpn}(F>1@T)$. Also, temperature can be used to correct the accuracy of the F factors, or it can be the variable to decide placement relative to a peak temperature.

Figure 8:
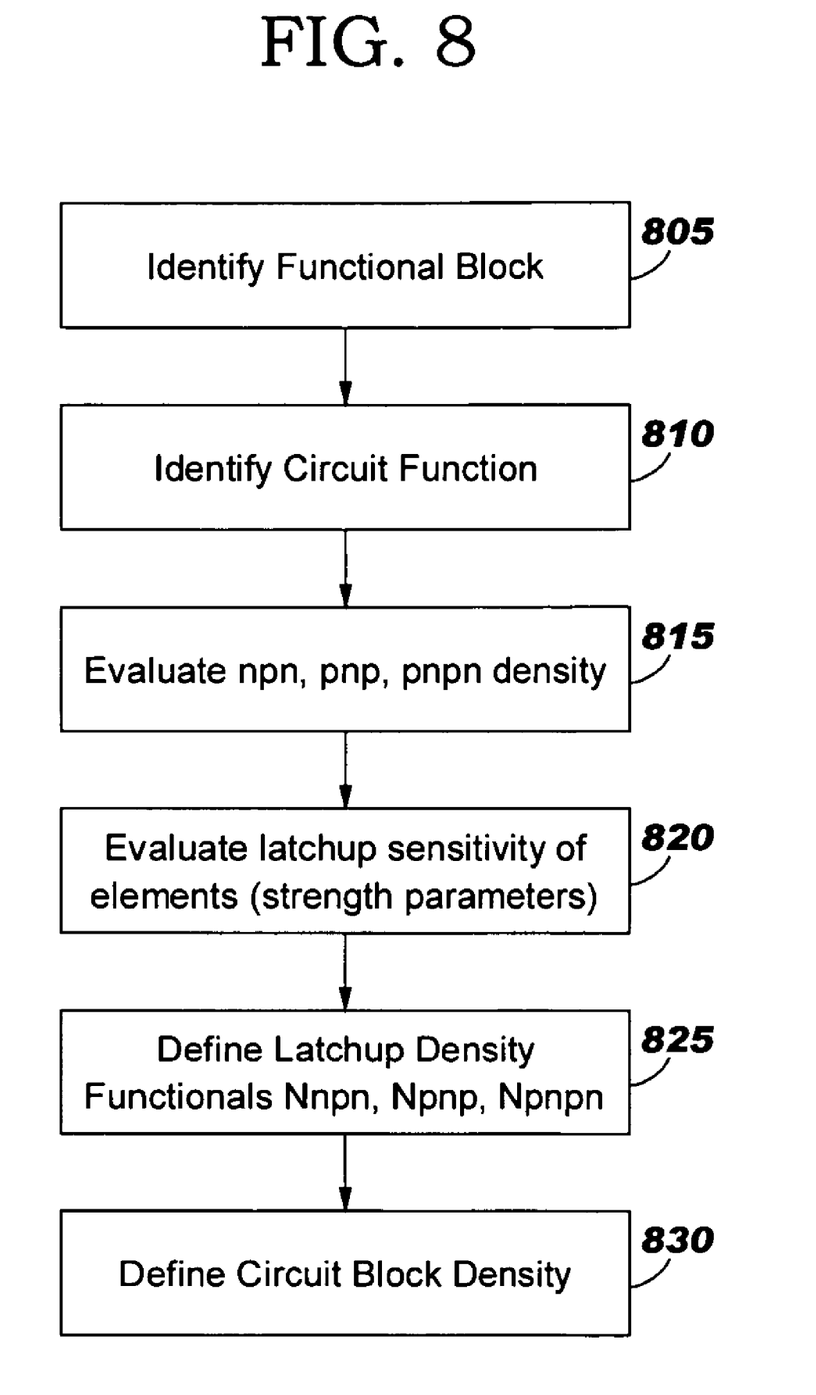
FIG. 8 is a flowchart showing analysis of placement based on the pnpn density relative to injection sources, strength based on the functional block.

FIG. 8 is a flow chart showing steps of the invention. The steps of the invention may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). FIG. 8 (and FIG. 9) may equally represent a high level block diagram of the system of the invention, implementing the steps thereof.

Figure 9:
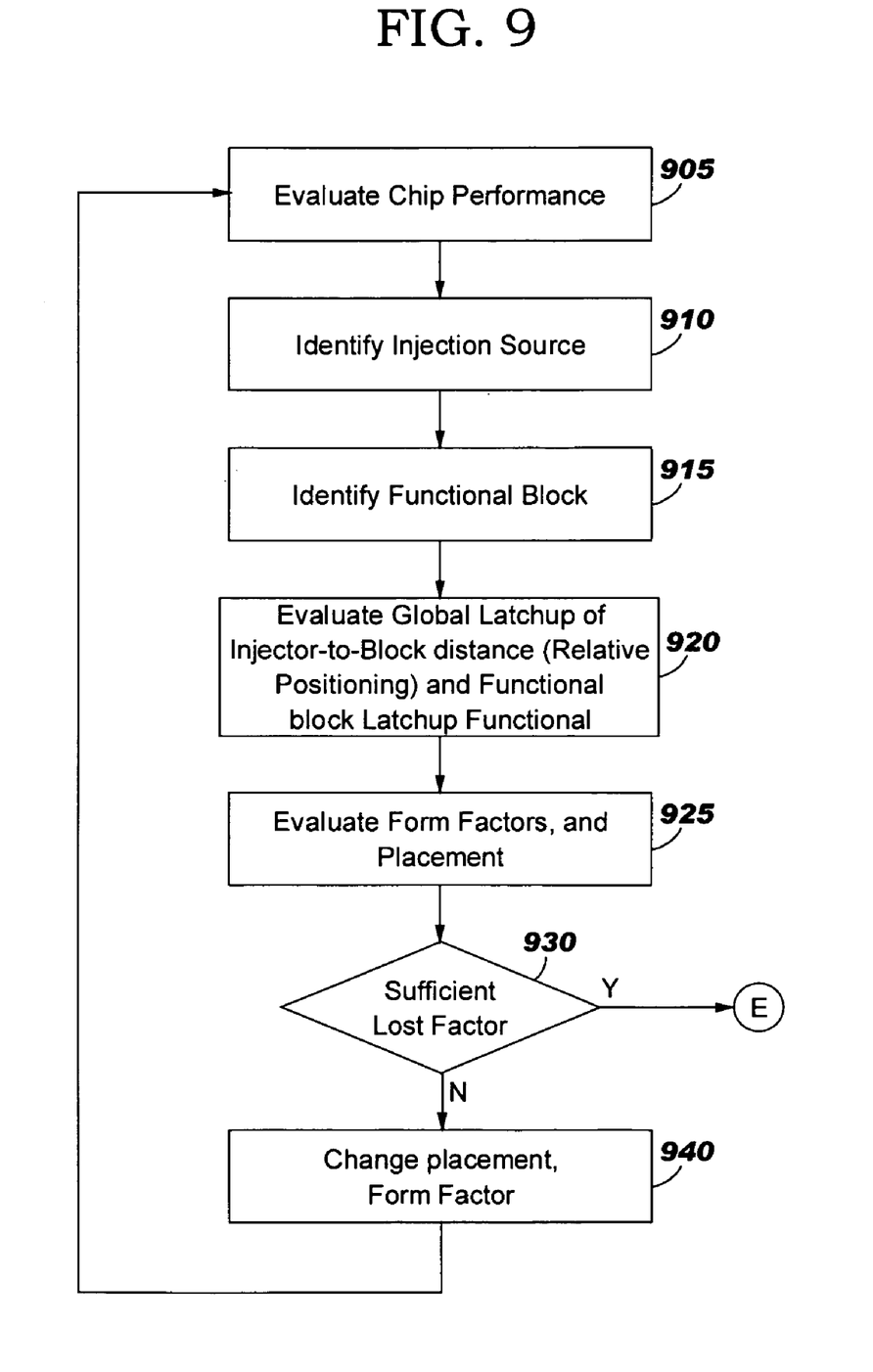
FIG. 9 is a flowchart showing re-optimization of the chip functional block placement to optimize chip performance and minimize latchup sensitivity according to the invention.

FIG. 8, more specifically, shows a method for the analysis of placement based on the pnpn density relative to injection sources, strength based on the functional block. Using the latchup density factor, the details of the propagation process can be simplified for global placement of the functional blocks. This avoids addressing all the inter-coupling issues. More specifically, at step 805, the function block is identified. At step 810, the circuit function is identified. At function block 815, npn, pnp, pnpn density is evaluated. At function block 820, the latchup sensitivity of the elements (strength parameters) is evaluated. At function block 825, the latchup density functionals Nnpn, $N_{pnp}$, $N_{pnpn}$ are defined. At function block 830, the circuit block density is defined. The flow of FIG. 8 quantifies the density circuit functions of circuit densities and defines the latchup density functions by, for example, taking the shapes and counting and building distribution functions. FIG. 9 is a methodology of an embodiment for re-optimization of the chip functional block placement to optimize chip performance and minimize latchup sensitivity according to the teachings of the invention. From the latchup density function, the placement of the functional blocks can be chosen relative to injection sources. This can be addressed using the spatial distance from injection virtual levels that can be placed on injection sources. The placement of the book type or functional block can be addressed and integrated into the timing issue.

In function block 905, the chip performance is evaluated. In function block 910, the injection source is identified. In function block 915, the functional block identified. In function block 920, the global latchup of injector-to-block distance (relative positioning) and functional block latchup functional is evaluated. In function block 925, the form factors and placement are evaluated. In function block 930, a determination is made as to whether this placement provides a sufficient cost factor. If yes, then the process ends at "E". If the placement does not provide a sufficient cost factor, then in function block 940, the form factor and placement are changed. Then the process then reverts back to function block 905 to again provide an evaluation based on the changed placement and form factor.

Since latchup can propagate across functional blocks, the form factor and size of the circuit blocks are used for the development as well as the latchup density function. Form factors (e.g., decoupling capacitors) can be used to optimize the floor planning. While the invention has been described in terms of embodiments, those skilled in the art will recognize that the invention can be practiced with modification within the spirit and scope of the appended claims. For example, the invention can be readily applicable to bulk substrates.

The invention claimed is:

1. A method of optimizing latchup robustness in integrated circuits comprising the steps of:
    identifying element density of at least one functional circuit block;
    identifying element attributes of elements associated with the at least one functional circuit block;
    forming an element density function parameterized from the element attributes;
    modifying placement of the at least one functional circuit block relative to other functional circuit blocks based on the element density function to substantially eliminate latching effects in a circuit; and
    controlling a global placement of the at least one functional circuit block relative to injection sources in order to optimize chip performance.

2. The method of claim 1, wherein the element density is at least one of PFET density and NFET density.

3. The method of claim 2, wherein the modifying placement step includes:
    placing the NFET density of a given functional circuit block away from a source of undershoot; and
    placing the PFET density of a given functional circuit block away from a source of overshoot.

4. The method of claim 1, wherein the step of identifying element attributes includes identifying at least one of sensitive to temperature, power, overshoot, undershoot, external sources, injection mechanisms, element pair density and strength and latchup resiliency, orientation and form factor in the at least one functional circuit block and spatial density.

5. The method of claim 1, further comprising providing decoupling capacitor elements to fill space or add capacitance to eliminate propagation adjacent an injection source to avoid propagation of latchup or soft latchup.

6. The method of claim 1, wherein prior to the modifying placement step, the method further comprising the steps of determining at least one of:
    (i) orientation and placement of an injecting source;
    (ii) distance between an ESD element and adjacent region of high pnpn density;
    (iii) form factors of the at least one functional circuit block;
    (iv) guard ring utilization between adjacent functional circuit blocks;
    (v) NPN density—Number of npn per unit area;
    (vi) NPN parameter strength (current gain);
    (vii) PNP density—Number of pnp per unit area;

(viii) PNP parameter strength (pnp current gain);
(ix) parameterization of the NPN density as a function of strength parameters statistics;
(x) parameterization of the PNP density as a function of the strength parameters statistics;
(xi) PNPN density; and
(xii) PNPN parameter strength.

7. The method of claim 1, wherein identifying element density of the at least one functional circuit block includes identifying element density at a perimeter of the at least one functional circuit block to determine a surface density function on the perimeter.

8. The method of claim 1, wherein the modifying placement step includes spacing the at least one functional circuit block apart from the other functional circuit blocks to reduce coupling strength between elements associated therewith.

9. The method of claim 1, further comprising at least one of:
predicting a latchup tolerance;
predicting latchup within the at least one functional circuit block;
utilizing latchup as a design placement criteria for global interactions of the at least one functional circuit block relative to another functional circuit block;
identifying a form factor and either spatial densification or layout optimization of the at least one functional circuit block in order to influence propagation of latchup throughout the chip; and
evaluating a global latchup of injector-to-block distance and a functional block latchup functional.

10. A method comprising the steps of:
identifying element density of at least one functional circuit block;
identifying element attributes of elements associated with the at least one functional circuit block;
forming an element density function parameterized from the element attributes;
modifying placement of the at least one functional circuit block relative to other functional circuit blocks based on the element density function to substantially eliminate latching effects in a circuit; and
determining magnitude of latchup sensitivity of a specific circuit by:

$$F = \beta_{NPN}\beta_{pnp}/[(I_{DD}+I_{RW}\beta_{npn})/(I_{DD}-I_{RW}-I_{RS}(\beta_{npn}+1)/(\beta_{npn}))]$$

wherein when (i) F is less than 1, then latchup does not occur and (ii) F>1 then latchup will occur.

11. The method of claim 10, wherein:
a relative distance between a location of an injecting source and a collecting circuit at (i) comprising elements associated with the at least one functional circuit block is designated as a vector R $r_i$, where an injector is at a vector position R and a collecting structure is at vector position $r_i$;
a relative distance between the location of a first circuit at (i) and a second circuit (j) of the at least one functional circuit block is designated as a vector $r_ir_j$;
a spatial function is established which is a relative strength of injection source at R at the position (i); and
wherein a function is created where:
(i) if an $N_{pnpn}(F>1)$ of a first chip region is greater than the $N_{pnpn}(F>1)$ of a second chip region then the first chip region is moved farther away from the injection region;

(ii) if the $N_{pnpn}(F<1)$ of the first chip region is greater than the $N_{pnpn}(F<1)$ of the second chip region then the first chip region is moved closer to the injection region; and
(iii) if the $N_{pnpn}(F)=0$ for the first chip region, then the first chip region is move closest to the injection region.

12. The method of claim 11, wherein an injection current strength is defined as:

$$I_{injection} = [I_{inj}(R)/|R-r_i|^2]\exp\text{-}\{|R-r_i|(D_c)^{1/2},\}$$

where I injection=$I_{RW}$,
wherein when the at least one functional circuit block contains elements whose initial state is F>1 after placement of the functional circuit block, the method further includes the steps of:
performing a re-optimization of local elements by changing spacing of well contact and substrate contacts associated with the elements.

13. The method of claim 11, wherein placement is chosen based on peak temperature at location R.

14. A method comprising the steps of:
identifying element density of at least one functional circuit block;
identifying element attributes of elements associated with the at least one functional circuit block;
forming an element density function parameterized from the element attributes; and
modifying placement of the at least one functional circuit block relative to other functional circuit blocks based on the element density function to substantially eliminate latching effects in a circuit,
wherein the element density function includes:
counting independent BP shapes indicating a number of pnp elements thereby determining a number of p diffusions associated with the at least one functional circuit block; and
counting of independent ROX shapes indicating the number of npn elements associated with the at least one functional circuit block.

15. The method of claim 14, further comprising determining a number of pnpn and npnp elements based on the number of npn elements and pnp elements to determine element density of the at least one functional circuit block.

16. A computer program product for optimizing latchup robustness in integrated circuits comprising:
a computer usable medium having computer readable program code embodied in the medium, the computer program product having:
computer program for identifying element density of at least one functional circuit block;
computer program for identifying element attributes of elements associated with the at least one functional circuit block;
computer program for forming an element density function parameterized from the element attributes;
computer program for modifying placement of the at least one functional circuit block relative to other functional circuit blocks based on the element density function to substantially eliminate latching effects in a circuit; and
computer program for controlling a global placement of the at least one functional circuit block relative to injection sources in order to optimize chip performance.

* * * * *

UNITED STATES PATENT AND TRADEMARK OFFICE
CERTIFICATE OF CORRECTION

PATENT NO. : 7,089,520 B2 Page 1 of 1
APPLICATION NO. : 10/707069
DATED : August 8, 2006
INVENTOR(S) : S. H. Voldman It is certified that error appears in the above-identified patent and that said Letters Patent is hereby corrected as shown below:

At column 16, line 5 of the printed patent, "move" should be --moved--.

At column 16, line 8 of the printed patent, "1/2," should be --1/2)--.

At column 16, line 61 of the printed patent, "iniection" should be --injection--.

Signed and Sealed this

Twentieth Day of March, 2007

JON W. DUDAS
*Director of the United States Patent and Trademark Office*